(12) United States Patent
Nishihara

(10) Patent No.: US 7,236,413 B2
(45) Date of Patent: Jun. 26, 2007

(54) SEMICONDUCTOR MEMORY DEVICE

(75) Inventor: Toshiyuki Nishihara, Kanagawa (JP)

(73) Assignee: Sony Corporation (JP)

( * ) Notice: Subject to any disclaimer, the term of this patent is extended or adjusted under 35 U.S.C. 154(b) by 118 days.

(21) Appl. No.: 11/143,575

(22) Filed: Jun. 3, 2005

(65) Prior Publication Data
US 2005/0283657 A1  Dec. 22, 2005

(30) Foreign Application Priority Data
Jun. 7, 2004  (JP) ............................. 2004-168679

(51) Int. Cl.
*G11C 29/00* (2006.01)
(52) U.S. Cl. ............... 365/200; 365/230.01; 365/233.5
(58) Field of Classification Search ................ 365/200, 365/185.33, 230.01, 230.02, 233.5
See application file for complete search history.

(56) References Cited

U.S. PATENT DOCUMENTS
6,324,104 B1 * 11/2001 Matsui ....................... 365/200

FOREIGN PATENT DOCUMENTS
JP        11-120788        4/1999

* cited by examiner

*Primary Examiner*—Van Thu Nguyen
*Assistant Examiner*—Pho M. Luu
(74) *Attorney, Agent, or Firm*—Rader Fishman & Grauer PLLC; Ronald P. Kananen

(57) ABSTRACT

A semiconductor memory device, wherein an access to a first memory portion is made by referring to an address transformation table stored in a second memory portion, so that an access to a defective block is prevented; the second memory portion and the first memory portion are mounted on the same semiconductor chip, so that a part or all of address data input from outside the semiconductor chip can be made corresponding to an address of the second memory portion and input to the second memory portion without executing any calculation, and a stored pointer can be taken out at a high speed; and an access can be made to a memory at a high speed by following the address transformation table.

15 Claims, 8 Drawing Sheets

SEMICONDUCTOR MEMORY DEVICE

CROSS REFERENCES TO RELATED APPLICATIONS

The present invention contains subject matter related to Japanese Patent Application No. 2004-168679 filed in the Japanese Patent Office on Jun. 7, 2004, the entire contents of which being incorporated herein by reference.

BACKGROUND OF THE INVENTION

1. Field of the Invention

The present invention relates to a semiconductor memory device having a function of inhibiting an access to a memory region having a defect.

2. Description of the Related Art

In recent years, along with a development of semiconductor fine processing technologies, a remarkable development has been made to attain a larger capacity of a semiconductor memory. For example, a flash memory for storing files has already reached a capacity of 1G bits and is still under development of a larger capacity. On the other hand, however, a large number of defect points also arise. Particularly when making a memory cell finer, an effect of microscopic unevenness due to the production steps becomes large statistically and an occurrence rate of a cell defect itself becomes high. They appear as a large number of small defects arising on an entire chip.

Generally, a relief of a defect in a semiconductor memory is performed as below.

First, a one-system or two-system redundant word line group or redundant bit line group is prepared for each memory array, and a defect map corresponding to each redundant field is provided. A flag indicating whether a corresponding redundant field is used or not and position information of defect points are programmed in each of the defect maps by normally using a fuse. When an access is made to a memory array, the defect map is referred to, and an existence of a defect and a defect point thereof are specified and replaced by a redundant field.

However, because defects arising randomly in a small unit have increased in recent years as explained above, they cannot be fully handled by the defect relief method of the related art. Namely, in the above mentioned method of the related art, it becomes extremely difficult to relieve when a large number of small defects arise in one cell array. In that case, the entire chip becomes defective even if all other arrays are good. Accordingly, there are demands for a more flexible defect relief method having a high relief efficiency.

On the other hand, a method called remapping is sometimes used as a measure for correcting such defects of a semiconductor memory on the host apparatus side for accessing the semiconductor memory. This is a method of skipping defect points and using only normal parts by providing a second memory for storing an address transformation table on the host apparatus side and performing address transformation.

FIG. 8 is a view of a configuration example of a general system for performing remapping.

A host apparatus 1 is, for example, a computer having a CPU and accesses to a first memory 2 and a second memory 3 via a bus.

The first memory 2 is a block access memory for storing files. A size of one block is, for example, 512 bytes, and an address space is divided in units of blocks each having 512 bytes. When assuming that a memory capacity of the first memory 2 is 1 G bits, the number of blocks is 256 k (The "k" after the number indicates that the number is multiplied with 1024. It will be the same below.). In this case, the number of address bits is 18 bits, and a physical address region indicated by the hexadecimal system is "00000" to "3FFFF".

Also, the first memory 2 has spare bits for marking parity bits and defects, and a defect can be detected by examining these bits when reading data.

The second memory 3 is a memory provided separately for storing an address transformation table of the first memory 2. The host apparatus 1 accesses to the first memory 2 via the address transformation table of the second memory 3.

Normally, the second memory 3 is a semiconductor memory used as a main memory in the host apparatus 1 and the address transformation table is stored in a part of the region. When the second memory 3 is a DRAM of a 16-bit configuration, a physical address to be a pointer to the first memory 2 is stored in a two-word amount of the memory region.

FIG. 9 is a schematic view of remapping in the system shown in FIG. 8.

The host apparatus 1 scans contents of the first memory 2 successively from the 0 address in the physical address and, when the read portion is good, maps the address in the second memory 3. In the example in FIG. 9, two words are used each time from the physical address "10000" of the second memory 3 to map effective physical addresses of the first memory 2. The physical addresses "00001" and "00004" are defective in the first memory 2 and their physical addresses are deleted from the address transformation table in the second memory 3. In the present embodiment, a total of 15 defective blocks exist and the end of the logical address is "3FFF0".

When a table as above is once constructed, the host apparatus 1 accesses to the first memory 2 always via the table after that. When an application accesses a file, the logical address shown in FIG. 9 is used directly, and the logical address is transformed to a physical address in the first memory 2 based on the address transformation table in the second memory 3.

For example, when assuming that a logical address A1 is specified by an application, the host apparatus 1 calculates an address A2 in the second memory 2 by A2=10000+2×A1, and reads a two-word amount of data from the address A2. Then, an access to the first memory 2 is made by using the read data as the physical address in the first memory 2.

When the above method is used, even if some defective blocks exist, only good blocks can be used by eliminating them from the address transformation table and a defect relief can be flexibly performed.

[Patent Article 1] The Japanese Unexamined Patent Publication No. 11-120788

SUMMARY OF THE INVENTION

The above method of the related art, however, suffers from disadvantages as below.

The first disadvantage is that a load on the host apparatus and an overhead of an operation incidental to a memory access are large.

For example, the host apparatus has to scan the first memory 2 to construct an address transformation table in the second memory 3 every time the system starts up.

Also, at the time of data accessing, a large number of steps have to be performed by the host apparatus.

To explain this by using the example in FIG. 8, the host apparatus 1 first calculates a physical address of the second memory 3 from a logical address and stores the result in an address register inside the host apparatus 1. Next, the host apparatus 1 accesses the second memory 3 for two times by referring to a value in the register, retrieves a two-word amount of data and stores the same in a register inside the host apparatus 1. Furthermore, in turn, only after transferring the data retrieved from the second memory 3 to the address register, the host apparatus 1 accesses the first memory 2.

In the above accessing step, it is necessary to redundantly drive a system bus, address line and control line requiring a heavy load, so that an access delay to the first memory 2 becomes large and a power consumption remarkably increases.

Furthermore, the host apparatus has to perform these operations in accordance with different memory capacities and various specifications. Namely, a table having a different bit width and entry number has to be prepared for each memory, which is cumbersome.

The second disadvantage is that defect modes able to be relieved by the method of the related art are limited.

For example, in some defect modes, such that wiring on the process is short-circuited, an access to a defective block itself causes instability of the system.

Also, there are cases where it is hard to determine defective or good by an external host apparatus.

For example, the case where a mark region to be used for determining a defect in the first memory 2 itself is defective or uncertain may be mentioned. When such a defective block exists, defect determination cannot be made by accessing to the block from the external host apparatus, so that it cannot be handled by remapping as above.

The only way to deal with such a defective mode is to perform redundancy relieving processing of the related art by using a fuse inside the semiconductor chip, however, cutting of the fuse is troublesome as in the case of the related art, moreover, an area occupied by the fuse becomes large and performance of relieving declines.

The third disadvantage is that construction of an address transformation table takes time in the method of the related art, so that start-up of the system becomes extremely slow.

For example, to construct an address transformation table in the second memory 3, as explained above, it is necessary to retrieve address information of a defective block as information peculiar to a chip of the first memory 2 and to map on the second memory 3 only pointers to good blocks so that an access to the defective block is not normally made.

Such processing is performed normally at the time of starting up the system and executed by operations of scanning through stored contents in the first memory 2, referring to a defect mark recorded in a predetermined position of each block, and recording a corresponding pointer in the second memory 3, etc. However, this step takes a long time and start-up of the system is largely delayed.

The fourth disadvantage is that the method of the related art does not contribute to an improvement of a yield on defects of a block itself.

A reduction of a defective rate of the block itself is attained only by replacing a defect therein by a redundant cell in the defect relieving method using a fuse of the related art. However, when replacing a bit line or a word line in units of memory arrays by following the defect relieving method of the related art, internal defects of each block stored by a large number in a memory array cannot be efficiently relieved.

Therefore, it is desired to provide a semiconductor memory device capable of flexibly relieving a defect of a memory and suppressing an access delay and an increase of a power consumption brought by the defect relieving.

To overcome the above disadvantages of the related art explained above, according to the present invention, there is provided a semiconductor memory device, comprising a first memory portion; and a second memory portion configured to store a pointer indicating a memory region in the first memory portion. The second memory portion is formed on a semiconductor chip on which the first memory portion is formed. The second memory portion reads a pointer corresponding to an input address data, and the first memory portion reads or writes data in a memory region therefrom or therein in accordance with the pointer.

Preferably, the present invention comprises a first circuit formed on the semiconductor chip, for transmitting a signal from a terminal for inputting address data to the semiconductor chip to an address input terminal of the second memory portion; and a second circuit formed on the semiconductor chip, for transmitting a signal from a data reading terminal of the second memory portion to an address input terminal of the first memory portion.

According to the above invention, a pointer for indicating a memory region in the first memory portion is stored in the second memory portion formed on the same semiconductor chip as the first memory portion. When the second memory portion reads the pointer from a memory region specified by a part or all of input address data; the first memory portion reads or writes data in a memory region specified by a part or all of the pointer or in a memory region in accordance with the pointer.

As explained above, since the first and second memory portions are formed on the same semiconductor chip, the second memory portion can be freely designed to be matched with the first memory portion. For example, a part or all of input address data may be made corresponding to a memory region of the second memory portion, so that the pointer can be read from the second memory portion at a high speed without executing any address calculation, etc.

Also, reading of a pointer from the second memory portion and accessing to the first memory portion in accordance with the pointer can be performed in a circuit inside the semiconductor chip without sending or receiving data to or from a host apparatus provided outside of the semiconductor chip. For example, by using the first circuit and the second circuit, transmission of a signal from a terminal for inputting address data to the semiconductor chip to an address input terminal of the second memory portion and transmission of a signal from a data reading terminal of the second memory portion to an address input terminal of the first memory portion can be performed inside the semiconductor chip. As a result, steps causing a time loss and a power loss, such as driving a bus and control line outside the semiconductor chip and processing data in the host apparatus, become unnecessary and an access to the first memory portion via the second memory portion can be made at a high speed with less power.

Note that the second memory portion may read the pointer from a memory region specified by a part or all of input address data. The first memory portion may read or write data in a memory region specified by a part or all of the pointer or in a memory region specified by data, wherein a part or all of the pointer and the rest of the address data not input to the second memory portion are combined.

Also, in the above invention, the second memory portion may include a nonvolatile memory.

Due to this, for example, before shipping the product, a defect point of the second memory portion may be specified by using a testing device, etc. and it is possible to store a suitable pointer selected to prevent an access to the specified defect point in the second memory portion in advance. As a result, as to a defect point, which cannot be specified by the remapping method of the related art for constructing an address transformation table by a host apparatus provided outside of the semiconductor chip, an access can be effectively prevented. Accordingly, it becomes unnecessary to use the defect relieving method of the related art using a fuse.

Furthermore, it is not necessary to construct an address transformation table every time the system starts up as in the remapping method of the related art, so that the start-up becomes high at speed.

Note that the first memory portion preferably includes a nonvolatile memory formed on the semiconductor chip by a common production step with the second memory portion. Due to this, a production step of a memory element is shared by the first memory portion and the second memory portion, so that the configuration of the present invention can be realized with out increasing the number of steps.

Also, preferably, the second memory portion includes a nonvolatile memory, wherein a failure rate of a memory element is lower comparing with that in the first memory portion. Due to this, an access to a defect point of the first memory portion can be prevented more certainly by using a pointer stored in the second memory portion. A capacity of the second memory portion may be much smaller comparing with that of the first memory portion, so that even in the case of using an element having a low failure rate and large occupying area as each memory element of the second memory portion, an increase of a circuit area as a whole is suppressed to little to attain an improvement of the operation margin and a reduction of the failure rate.

Also, the above invention may comprise a third memory portion formed on the semiconductor chip and including a nonvolatile memory for storing the pointer; and the second memory portion may include a RAM, wherein the pointer stored in the third memory is loaded at the time of starting up. The RAM may be, for example, a DRAM or an SRAM.

Since an access speed is generally high in a RAM, such as a DRAM and SRAM, the pointer can be retrieved at a high speed in the second memory portion due to the above configuration, so that the entire access speed becomes high.

Also, since the second memory portion and the third memory portion are formed on the same semiconductor chip, the both can be connected by using a very wide bus in the semiconductor chip, so that the pointer can be loaded at a high speed from the third memory portion to the second memory portion. Accordingly, start-up can become also high at speed in this case comparing with the case of the remapping method of the related art.

Note that it is preferable that the first memory portion includes a nonvolatile memory formed on the semiconductor chip by a common production step as the third memory portion. Due to this, a production step of a memory element is shared by the first memory portion and the third memory portion, so that the configuration of the present invention can be realized with out increasing the number of steps.

Also, the third memory portion preferably includes a nonvolatile memory, wherein a failure rate of a memory element is lower comparing with that in the first memory portion. Due to this, an access to a defect point of the first memory portion can be prevented more certainly by using a pointer stored in the third memory portion.

Also, in the present invention, the second memory portion may include a RAM, wherein the pointer is loaded from outside of the semiconductor chip at the time of starting up.

The configuration is effective, for example, when the first memory portion is a DRAM and a nonvolatile memory is hard to be formed on the semiconductor chip or the cost is increased.

In this case, it is preferable that the first memory portion and the second memory portion are DRAMs formed on the semiconductor chip by a common production step. Due to this, the configuration of the present invention can be realized with out increasing the number of steps.

Also, preferably, the second memory portion includes a DRAM, wherein a failure rate of a memory element is lower comparing with that in the first memory portion. Due to this, an access to a defect point of the first memory portion can be prevented more certainly by using a pointer loaded to the second memory portion.

Note that the second memory portion may store predetermined invalid data in a memory region of not storing the pointer; and a first access inhibition circuit may be provided for determining whether data read from the second memory portion is the invalid data or not and, inhibiting an access to the first memory when it is determined to be the invalid data. Due to this, an access to the first memory portion can be effectively inhibited when the input address data specifies a memory region not storing the pointer in the second memory portion.

Alternately, the first memory portion may have a larger memory region than a memory region able to be specified as an access object by the input address data. Due to this, probability that the input address data specifies an address not storing the pointer in the second memory portion becomes small.

Also, in the present invention, the second memory portion may store the pointer and defect information on a defect included in a memory region corresponding to the pointer of the first memory portion and, when reading the pointer, read also defect information corresponding to the pointer. Due to this, defect information in a memory region can be retrieved at a high speed for each memory region corresponding to the pointer.

Furthermore, a second access inhibition circuit for inhibiting an access to a specified position when the defect information specifies the position of a defect may be provided. Due to this, it is possible to inhibit an access to a defect point in a memory region corresponding to the pointer.

Additionally, the first memory may have a spare memory region for each memory portion corresponding to the pointer; and the second access inhibition circuit may change an access to the first memory portion from an access to a memory region including a defect to an access to the spare memory portion when a position of the defect is specified by the defect information. Due to this, when a defect arises in a memory region corresponding to the pointer, by switching an access to the defect position to an access to a spare memory region, a defect in a small unit can be effectively relieved.

Also, the first memory portion may store data subjected to error correction encoding processing. Due to this, it becomes possible to effectively relieve a defect in a smaller unit, such as a unit of one bit.

According to the present invention, it is possible to flexibly relieve a defect of a memory, and an access delay and an increase of a power consumption brought by the defect relieving can be suppressed.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, the present invention will be explained by four embodiments with reference to the drawings.

First Embodiment

Figure 1:
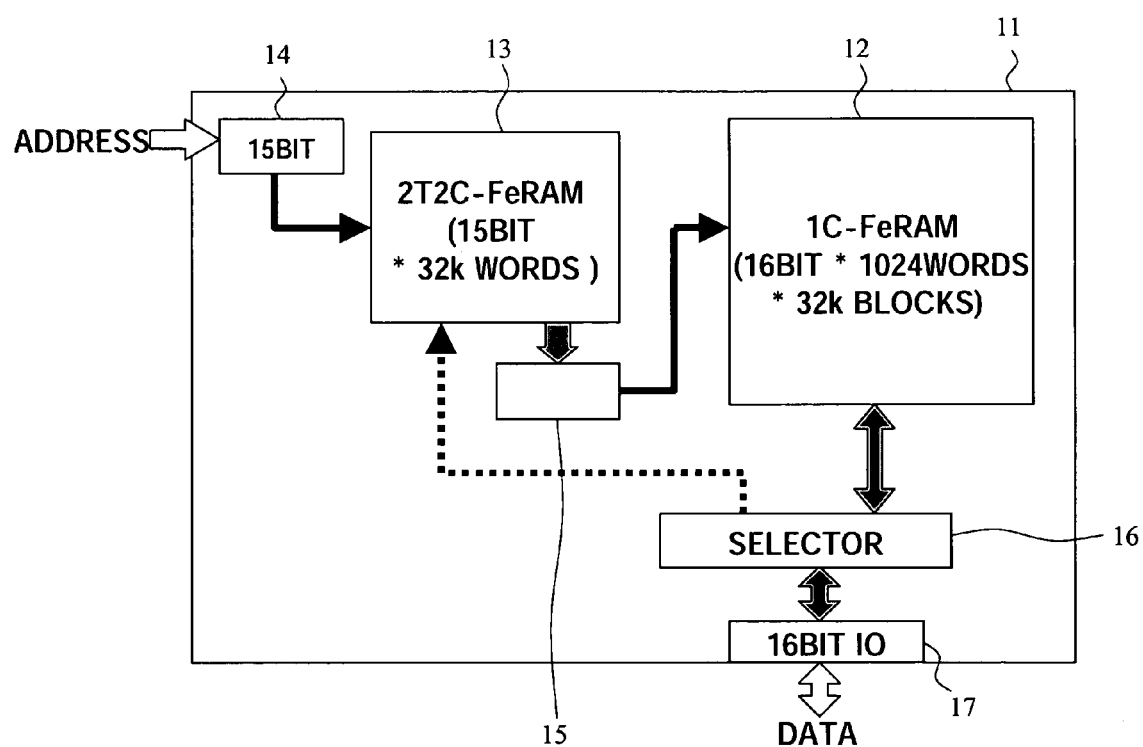
FIG. 1 is a view of an example of the configuration of a semiconductor memory device according to a first embodiment.

FIG. 1 is a view of an example of the configuration of a semiconductor memory device according to a first embodiment of the present invention.

The semiconductor memory device shown in FIG. 1 includes a first memory portion 12, a second memory portion 13, registers 14 and 15, a selector 16 and an input/output circuit 17, formed on a same semiconductor chip 11.

Note that the first memory portion 12 is an embodiment of a first memory portion of the present invention.

The second memory portion 13 is an embodiment of a second memory portion of the present invention.

A circuit including the register 14 is an embodiment of a first circuit of the present invention.

A circuit including the register 15 is an embodiment of a second embodiment of the present invention.

The first memory portion 12 is a memory portion corresponding to a body memory for storing user data and is composed of memory blocks by the number of about 32 k in the present embodiment.

Each memory block of the first memory portion 12 is composed of a memory unit group formed by IC type ferroelectric memory cells as described in the articles "The Japanese Unexamined Patent Publication No. 2000-349248" and "The Japanese Unexamined Patent Publication No. 09-116107", wherein memory units for connecting 16 cells in common are arranged by the number of 1 k in the word line direction. Namely, a memory capacity of each memory block is about 2 k bytes (16 k bits). Also, a capacity of the first memory portion 12 as a whole is 512M bits.

In the first memory portion 12, one block is selected from the 32 k number of memory blocks by inputting a 15-bit address to the address decoder. When reading, data in the selected one block is serially output by 16 bits at a time successively.

The second memory portion 13 stores a pointer indicating a memory region in the first memory portion 12. The second memory portion 13 is composed of a 2T2C complementary type ferroelectric memory cell group as described, for example, in the article "The U.S. Pat. No. 4,873,664 specification". The 2T2C type cell has a wider cell area comparing with that of the above 1C type cell, but the operation margin is large and the failure rate is low. Memory elements of the 2T2C type cell and the 1 C type cell are the same ferroelectric capacitors, which can be produced in the same process. Therefore, the number of production steps is not changed by adding the second memory portion 13.

The second memory portion 13 has, for example, a 15-bit input and output and is formed by 32 k words. Accordingly, by inputting 15-bit address data to the address decoder, one word is selected and 15 bits of data is output. In this case, a capacity of the second memory portion 13 is 480 k bits, which is far smaller than that of the first memory portion 12. Therefore, even when the 2T2C type cell having a wide cell area is used as the second memory portion 13, the area is not increased much.

The register 14 latches address data input to the semiconductor chip 11 and input the same to the second memory portion 13.

The register 15 latches a pointer read in the second memory portion 13 and input the same as address data to the first memory portion 12.

The input/output circuit 17 is a circuit for being input and outputting write data and read data of the semiconductor memory device, and a 16-bit signal is input and output in the present embodiment.

The selector 16 connects a 16-bit signal line of the input/output circuit 17 to a data input/output terminal of the first memory portion 12 or the second memory portion 13. Switching of this connection is made in response to a not shown control signal, for example, supplied from the outside of the semiconductor chip 11.

Here, an operation example of the semiconductor device shown in FIG. 1 configured as the above will be explained.

When 15-bit address data is input to the semiconductor chip 11, the address data is latched by the register 14 and input to an address decoder of the second memory portion 13.

In the second memory portion 13, data to be a pointer to the first memory portion 12 is read from a memory region corresponding to the input address data and latched by the register 15.

The data latched by the register 15 is input as address data of the first memory portion 12 to the address decoder and, thereby, one memory block is selected in the first memory portion 12. From the selected memory block, a total of 2 k bytes of data having a 16-bit width is serially output to the selector 16 successively. They are output as they are as 16-bit read data from the input/output circuit 17 to the outside of the semiconductor chip 11.

The above explanation is an operation at reading data, but also at writing data, one block is selected in the first memory portion 12 in the same way, and desired data in an amount of 2 k bytes is serially written therein by 16 bits at a time.

A pointer group of the first memory portion 12 stored in the second memory portion 13, that is an address transformation table, is configured to skip defective blocks existing in the first memory portion 12 as explained in the explanation on the remapping method above, thus, pointers of defective blocks are eliminated from the address transformation table for that purpose.

When writing an address transformation table to the second memory portion 13, connection of the selector 16 is switched by a control signal, for example, from the outside of the semiconductor chip 11, and 15 bits in the 16-bit signal line of the input/output circuit 17 is connected to the second memory portion 13. As a result, desired data input from the input/output circuit 17 is written in a memory region of the second memory portion 13 corresponding to the address data input to the register 14.

As explained above, according to the semiconductor memory device shown in FIG. 1, since the second memory portion 13 for storing the address transformation table and the first memory portion 12 as the body memory are mounted on the same semiconductor chip 11, the second memory portion 13 can be freely designed to be matched with the first memory portion 12. Accordingly, for example, a part or all of address data input from the outside of the semiconductor chip 11 as it is can be made corresponding to the memory region of the second memory portion 13, and input to the address decoder of the second memory portion 13 without any calculation, and a pointer to be stored can be taken out at a high speed. As a result, address calculation as in the remapping method of the related art becomes unnecessary and a high access speed can be attained.

Also, according to the semiconductor memory device shown in FIG. 1, processing of reading a pointer form the second memory portion 13 and processing of accessing the first memory portion 12 in accordance with the read pointer can be performed by a circuit inside the semiconductor chip 11 without exchanging data with the external host apparatus. Namely, as a result that the address data input to the semiconductor chip 11 is transferred to the address input terminal of the second memory portion 13 via the register 14 and a pointer read from the second memory portion 13 is transferred to the address input terminal of the first memory portion 12 via the register 15, the above processing can be performed inside the semiconductor chip 11. Consequently, steps causing a time loss and a power loss, such as driving a bus and control line requiring a large capacity load provided outside the semiconductor chip 11 and processing data in the host apparatus, become unnecessary, and a high speed access to the first memory portion 12 via the second memory portion 13 with a less power becomes possible.

Moreover, since all of the above processing is performed by the semiconductor memory device itself, the external host apparatus does not have to perform other processing than normal memory accesses. Therefore, a processing load on the host apparatus can be widely reduced.

Also, as far as the second memory portion 13 is provided inside the semiconductor chip 11 and a pointer of the first memory portion 12 is stored appropriately in the second memory portion 13, an access to a defective point from the outside can be completely inhibited even if any mode defect arises in the first memory portion 12. Accordingly, a use of redundancy by a fuse, etc. in the related art in accordance with the defect mode becomes unnecessary.

Note that "appropriate storing" here means that a pointer to the first memory portion 12 appropriately selected, so that an access is not made to a defect point of the first memory portion 12 specified by a testing device, etc. is written in a nonvolatile memory of the second memory portion 13 in advance before using the semiconductor memory device (for example, before shipping the product). When using a nonvolatile memory as the second memory portion 13, the above "appropriate storing" can be easily made in each of the semiconductor memory devices to be produced.

Also, if the first memory portion 12 is a nonvolatile memory, the production step of memory elements can be shared by the second memory portion 13 and the first memory portion 12, so that the number of steps is not increased.

Furthermore, by using a nonvolatile memory, wherein a failure rate of the memory element is lower comparing with that of the first memory portion 12, as the second memory portion 13, defects arise less in the second memory portion 13 itself, so that an access to a defect point of the first memory portion 12 can be prevented more certainly by referring to the address transformation table of the second memory portion 13.

In this case, a memory capacity of the second memory portion 13 may be much smaller comparing with that of the first memory portion 12, so that the cost is not increased much by using as the second memory portion 13 a nonvolatile memory having a large area of effective bits and a low failure rate.

Also, according to the semiconductor memory device shown in FIG. 1, an address transformation table does not have to be reconstructed every time the system starts up, so that time for constructing the address transformation table as in the remapping method of the related art can be omitted and start-up of the system at a high speed can be attained.

When configured as explained above, invalid fields arise exactly by the number of defective blocks existing in the first memory portion 12 near the end of a 15-bit address range, that is "0000" to "7FFF" in the hexadecimal system. When a user erroneously accesses this part, there is a possibility that an access is made to an uncertain field of the first memory portion 12. This can be prevented, for example, by providing a means for inhibiting an access to invalid address fields as will be explained below.

Figure 2:
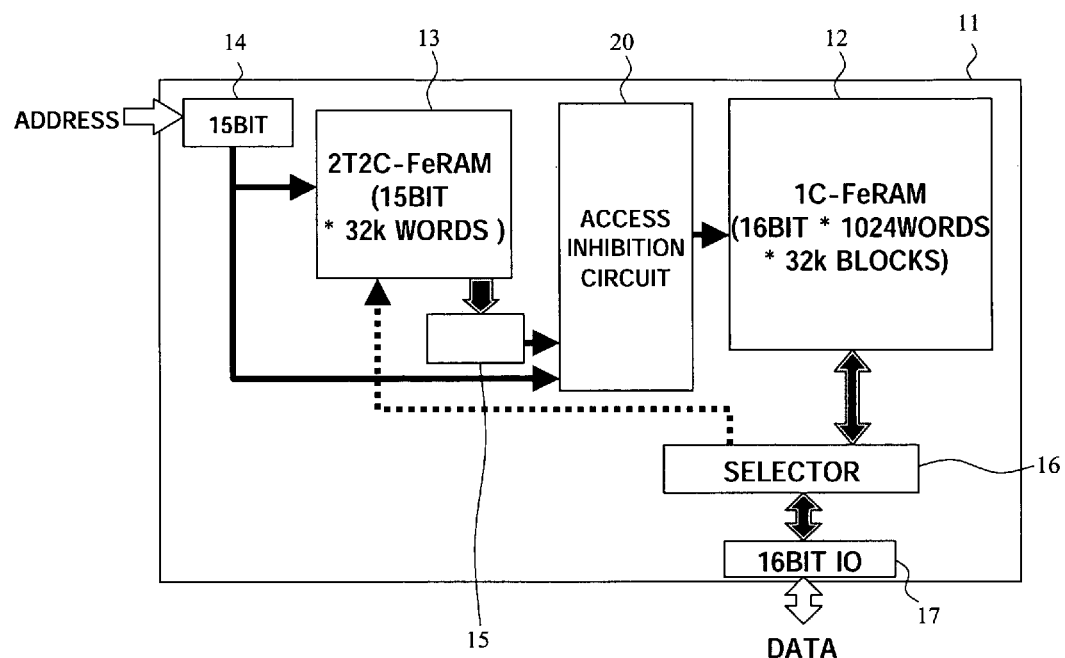
FIG. 2 is a view of a configuration example of a semiconductor memory device provided with an access inhibition circuit.

FIG. 2 is a view of a configuration example of a semiconductor memory device according to the present embodiment, wherein an access inhibition circuit is provided.

The semiconductor memory device shown in FIG. 2 is the semiconductor memory device shown in FIG. 1 provided with an access inhibition circuit 20 as an embodiment of a first access inhibition circuit of the present invention, and other configuration thereof is the same as that of the semiconductor memory device shown in FIG. 1.

In the semiconductor device shown in FIG. 2, the second memory portion 13 stores predetermined invalid data in a memory region not storing a pointer to the first memory portion 12.

The access inhibition circuit 20 determines whether the data read from the second memory portion 13 is the predetermined invalid data or not and, when determined that it is the invalid data, inhibits an access to the first memory portion 12.

For example, the second memory portion 13 stores a pointer having a value "0" as the pointer indicating a top address of the first memory portion 12 in a memory region not storing a pointer. Normally, the value "0" in the address transformation table is stored at the top of the table and is not stored near the end of the table. Thus, for example, when a value of the address data stored in the register 14 is larger than a predetermined value and data of a value "0" is output as a pointer from the second memory portion 13, the access inhibition circuit 20 determines that it is an error and inhibits an access to the first memory portion 12.

Furthermore, when such a case arises, it is preferable that the access prohibition circuit 20 notifies the user of the error by changing a value of a specific pin in the semiconductor chip 11 or outputting a specific value. Due to this, it becomes possible, for example, for the host apparatus to perform reading by scanning from the address range minimally guaranteed by the memory at the time of starting up the system to determine as the end of an effective address the previous address of a point the above error is notified.

Alternately, as another countermeasure of the method by the address inhibition circuit as explained above, the first memory portion 12 may be provided with a larger memory region than the memory region able to be specified as an access object by address data input to the semiconductor chip 11.

For example, when assuming that a spare is provided to a capacity of the first memory portion 12 and the total block number is 35 k, the number of bits of an input address of the first memory portion 12 is increased to 16 bits. Namely, an output of the second memory portion 13 is also made to be 16 bits. As a result, as far as a defect exceeding the 3 k number of memory region provided as a spare does not arise, 15 bits of address range in the address transformation table in the second memory portion 13 can be all correctly mapped to normal blocks in the first memory portion 12, so that an access to an invalid field as above is not made.

Second Embodiment

Next, a second embodiment of the present invention will be explained.

Figure 3:
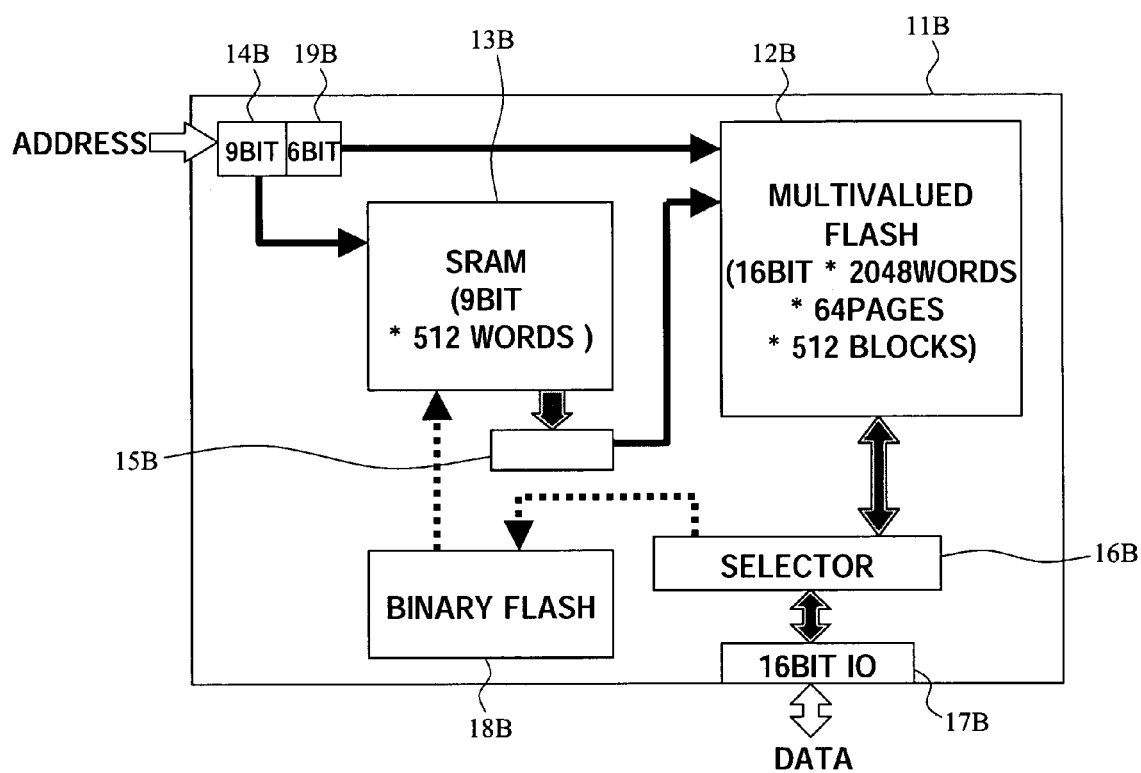
FIG. 3 is a view of an example of the configuration of a semiconductor memory device according to a second embodiment.

FIG. 3 is a view of an example of the configuration of a semiconductor memory device according to the second embodiment of the present invention.

The semiconductor memory device shown in FIG. 3 includes a first memory portion 12B, a second memory portion 13B, a third memory portion 18B, registers 14B, 15B and 19B, a selector 16B and an input/output circuit 17B, formed on the same semiconductor chip 11B.

Note that the first memory portion 12B is an embodiment of a first memory portion of the present invention.

The second memory portion 13B is an embodiment of a second memory portion of the present invention.

The third memory portion 18B is an embodiment of a third memory portion of the present invention.

A circuit including the register 14B is an embodiment of a first circuit of the present invention.

A circuit including the register 15B is an embodiment of a second circuit of the present invention.

The first memory portion 12B is a memory portion corresponding to a body memory for storing user data and is composed of memory blocks by the number of about 512 in the present embodiment.

The first memory portion 12B, for example, has a multi-valued NAND type flash memory, wherein one page as an access unit is formed by 16 k number of memory cells for storing 2 bits. A size of one page is 32 k bits (4 k bytes).

On the other hand, each memory block is formed by 64 pages, and a size of one memory block is 256 k bytes.

An access to the flash memory is made in units of pages, but erasure is made collectively in units of memory blocks. When a memory cell has a defect, such as tunnel oxidization film breaking, it often affects an entire memory block including the memory cell, so that a defect is managed in units of memory blocks.

In the first memory portion 12B, one page is selected by an input of 9-bit block address and an input of 6-bit page address to an address decoder thereof. At reading, data in the selected one page is serially output by 16 bits at a time successively.

The second memory portion 13B receives a pointer indicating a memory region (memory block) in the first memory portion 12B from the later explained third memory portion 18B at the time of starting up and stores the same.

The second memory portion 13B has, for example, a CMOS type SRAM and can be easily added in a normal production process.

The second memory portion 13B has, for example, a 9-bit input and output and is composed of 512 words. Accordingly, by inputting 9 bits of address data to the address decoder, one word is selected and 9 bits of data is output. In this case, a capacity of the second memory portion 13B is 4.6 k bits, which is far smaller than that of the first memory portion 12B. Therefore, even when an SRAM having a wide cell area is used as the second memory portion 13B, the area is not increased much.

The third memory portion 18B stores an address transformation table in the semiconductor chip 11B. The third memory portion 18B is, for example, a NAND-type flash memory, wherein the number of memory cells serially connected as a cell string is reduced from that in the first memory portion 12B.

Although a binary type NAND type flash cell has a larger cell area comparing with that of multivalued type ones, the operation margin is large and the failure rate is low. A binary type memory element has the same floating gate as that of multivalued ones and produced by the same process. Therefore, the number of production steps is not changed even if the third memory portion 18B is added.

The registers 14B and 19B latch 16-bit address data input to the semiconductor chip 11.

The register 14B latches 9-bit address data corresponding to a memory block address of the first memory portion 12B.

The register 19B latches 6-bit address data corresponding to a page address of the first memory portion 12B.

The register 15B latches a pointer of the first memory portion 12B read in the second memory portion 13B and inputs the same as address data of a memory block to the first memory portion 12B.

The input/output circuit 17B is for being input and outputting write data and read data of the semiconductor memory device, and a 16-bit signal is input and outputted in the present embodiment.

The selector 16B connects a 16-bit signal line of the input/output circuit 17B to a data input/output terminal of the first memory portion 12B or the third memory portion 18B. Switching of this connection is made in response to a not shown control signal, for example, supplied from the outside of the semiconductor chip 11B.

Here, an operation example of the semiconductor memory device shown in FIG. 3 configured as above will be explained.

When power is supplied to the semiconductor chip 11B, data of the address transformation table stored in the third memory portion 18B is transferred to the second memory portion 13B first. The transfer can be made at a high speed inside the chip. After that, an access is made to the first memory portion 12B via the address transformation table.

Specifically, 15-bit address data input to the semiconductor chip 11B is latched by the registers 14B and 19B, wherein 9 bits of the register 14B corresponding to a memory block address of the first memory portion 12B is input to an address decoder of the second memory portion 13B. As a result, data to be a pointer to the first memory portion 12B is output from the second memory portion 13B and latched by the register 15B. This data corresponds to a memory block address of the first memory portion 12B.

A memory block address of the register 15B is input to an address decoder of the first memory portion 12B together with a page address of the register 19B. As a result, one page in the first memory portion 12B is selected, and a total of 4 k bytes of data included therein is output serially in a 16-bit width to the selector 16B successively. They are output as they are as 16-bit read data to the outside of the semiconductor chip 11B from the input/output circuit 17B.

The above explanation is an operation at reading data, but also at writing data, one page is selected in the first memory portion 12B in the same way, and desired data in an amount of 4 k bytes is serially written therein by 16 bits at a time.

The address transformation table to be stored in the third memory portion 18B is configured to skip defective blocks existing in the first memory portion 12B as explained in the explanation on the remapping method above, so that pointers of defective blocks are eliminated from the data.

When writing the address transformation table in the third memory portion 18B, connection of the selector 16B is switched, for example, by a control signal from the outside of the semiconductor chip 11B, and write data to be input to the input/output circuit 17B is input to the third memory portion 18B.

As explained above, according to the semiconductor memory device shown in FIG. 3, an address transformation table stored in the third memory portion 18B in the semiconductor chip 11B is loaded to the second memory portion 13B composed of an SRAM or DRAM when the power is supplied.

Therefore, comparing with the case of configuring the second memory portion by a nonvolatile memory as in the semiconductor memory device shown in FIG. 1 and FIG. 2, an area occupied by the RAM portion becomes overhead, however, an access speed is generally very high in a DRAM and SRAM, so that a pointer output to the first memory portion 12B in response to input address data becomes high at speed and the access speed can be furthermore improved comparing with that in the embodiments explained above.

Also, when the first memory portion 12B is a nonvolatile memory, a production step of a memory element can be shared by the third memory portion 18B and the first memory portion 12B, so that the number of steps is not increased.

Furthermore, by using as the first memory portion 18B a nonvolatile memory, wherein a failure rate of the memory element is low comparing with that in the first memory portion 12B, it is possible to suppress arising of defects in the third memory portion 18B itself, so that an access to a defective point of the first memory portion 12B can be prevented more certainly by referring to the address transformation table of the third memory portion 13B.

Also, by forming the second memory portion 13B and the third memory portion 18B on the same semiconductor chip, the both can be directly connected by using a very wide bus in the semiconductor chip, so that the address transformation table can be instantly loaded from the third memory portion 18B to the second memory portion 13B. Accordingly, start-up can be made high at speed also in the present embodiment comparing with the remapping method of the related art.

Third Embodiment

Next, a third embodiment of the present invention will be explained.

Figure 4:
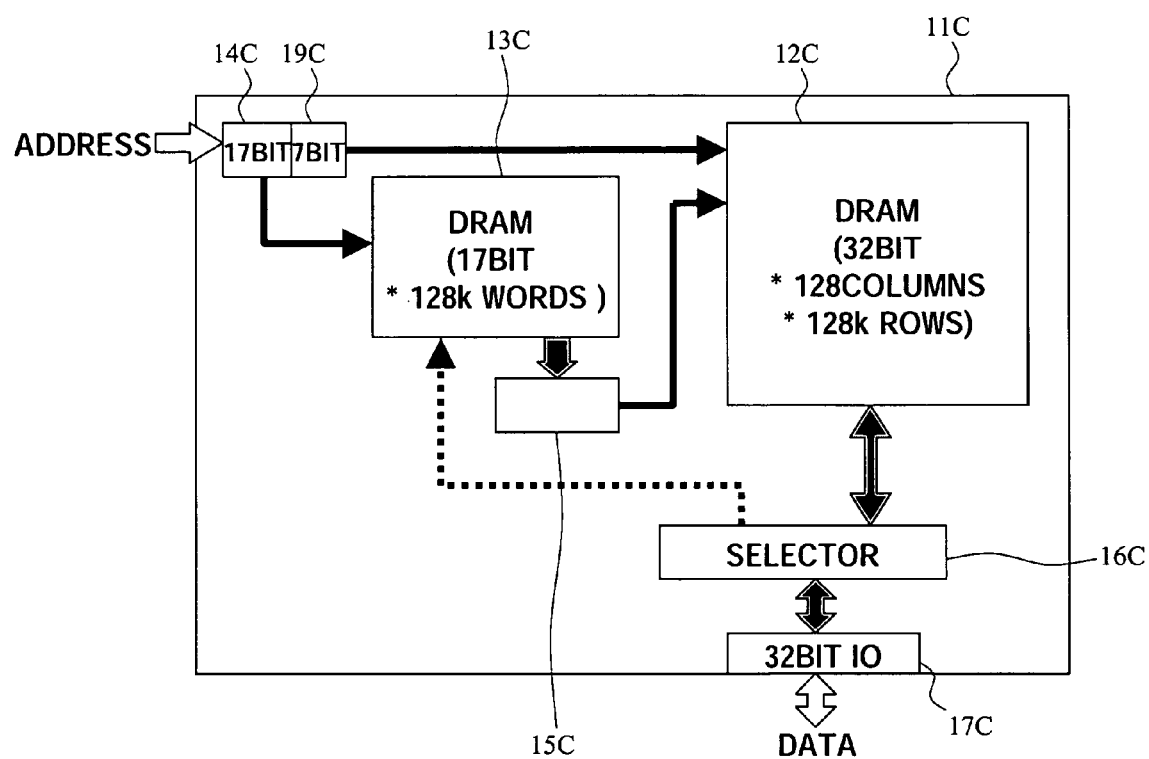
FIG. 4 is a view of an example of the configuration of a semiconductor memory device according to a third embodiment.

FIG. 4 is a view of an example of the configuration of a semiconductor memory device according to the third embodiment of the present invention.

The semiconductor memory device shown in FIG. 4 includes a first memory portion 12C, a second memory portion 13C, registers 14C, 15C and 19C, a selector 16C and an input/output circuit 17C, formed on the same semiconductor chip 11C.

Note that the first memory portion 12C is an embodiment of a first memory portion of the present invention.

The second memory portion 13C is an embodiment of a second memory portion of the present invention.

A circuit including the register 14C is a first circuit according to embodiment of the present invention.

A circuit including the register 15C is a second circuit according to embodiment of the present invention.

The first memory portion 12C is a memory portion corresponding to a body memory for storing user data and is composed of 128 k rows and 128 columns in the present embodiment.

A memory cell in the first memory portion 12C is, for example, a 1T1C type cell (a DRAM cell composed of one transistor and one capacitor) having an input and output of a 32-bit width in the present embodiment. Accordingly, a page size corresponding to one row is 128 words, that is 4 k bits.

In the first memory portion 12C, one row, that is one page, is selected from the 128 k rows by a 17-bit row address, and one column is selected from the 128 columns by a 7-bit column address. At reading, selected data of one 32-bit word is output from the input/output circuit 17C.

The second memory portion 13C stores a pointer indicating a memory region (page) in the first memory portion 12C.

The second memory portion 13C is also a DRAM as same as the first memory portion 12C, but the memory cell is, for example, a 2T2C complementary type cell (a DRAM cell composed of two transistors and two capacitors). Also, preferably, the capacitor size is designed to be larger than that of the first memory portion 12C.

Although the 2T2C type cell has a larger area comparing with that of the 1T1C type cell, it has characteristics that the operation margin is large and the failure rate is low. A memory element is a capacitor in both types and can be produced in the same process. Accordingly, even if the second memory portion 13C is added, the number of production steps is not changed.

The second memory portion 13C, for example, has a 17-bit input and output and composed of 128 k words. Therefore, one word is selected by inputting 17-bit address data to an address decoder thereof, and 17-bit data is output. A capacity of the second memory portion 13C is about 2 M bits, which is far smaller than that of the first memory portion 12C. Therefore, even when the 2T2C type having a larger cell area is used as the second memory portion 13C, the area is not increased much.

The registers 14C and 19C latch 24-bit address data input to the semiconductor chip 11.

The register 14C latches 17-bit address data corresponding to a row address of the first memory portion 12C.

The register 19B latches 7-bit address data corresponding to a column address of the first memory portion 12C.

The register 15C latches a pointer of the first memory portion 12C read in the second memory portion 13C and inputs the same as address data of a row address to the first memory portion 12C.

The input/output circuit 17C is for being input and outputting write data and read data of the semiconductor memory device, and a 32-bit signal is input and outputted in the present embodiment.

The selector 16C connects a 32-bit signal line of the input/output circuit 17C to a data input/output terminal of the first memory portion 12C or the third memory portion 18C. Switching of this connection is made in response to a not shown control signal, for example, supplied from the outside of the semiconductor chip 11C.

Here, an operation example of the semiconductor memory device shown in FIG. 4 configured as above will be explained.

A not shown host apparatus provided outside the semiconductor chip 11C transfers data of an address transformation table composed of pointers to the first memory portion 12C from a not shown external nonvolatile memory to the second memory portion 13C at the time of starting up. At this time, the selector 16C is controlled by a not shown control signal to connect the input/output circuit 17C and the second memory portion 13C, data of the address transformation table input from the input/output circuit 17C is input to the second memory portion 13C to be written.

When the address transformation table is transferred to the second memory portion 13C, after that, an access is made to the first memory potion 12C via the transformation table.

Specifically, 24-bit address data to be input to the semiconductor chip 11C is latched by the registers 14C and 19C, wherein 17 bits of the register 14 corresponding to a row address of the first memory portion 12C is input to an address decoder of the second memory portion 13C. As a result, data to be a pointer to the first memory portion 12C is output from the second memory portion 13C and latched by the register 15C. This data corresponds to a row address of the first memory portion 12C.

A row address of the register 15 is input to an address decoder of the first memory portion 12C together with a column address of the register 19C and, thereby, one word is selected in the first memory portion 12C and 32-bit (4 bytes) data is output to the selector 16C. They are output as they are as 32-bit read data to outside the semiconductor chip 11C from the input/output circuit 17C.

The above explanation is an operation at reading data, but also at writing data, one word is selected in the first memory portion 12C in the same way, and 32 bits of data is written therein.

The address transformation table to be loaded from the outside to the second memory portion 13C is configured to skip defective blocks existing in the first memory portion 12C as explained in the explanation on the remapping method above, so that pointers of defective blocks are eliminated from the address transformation table.

As explained above, according to the semiconductor memory device shown in FIG. 4, a RAM, such as an SRAM and DRAM, is used as the second memory portion 13C, and a pointer to the first memory portion 12C is loaded to the second memory portion 13C from outside of the semiconductor chip at the time of starting up.

Therefore, for example, when the first memory portion 12C is a DRAM, and a nonvolatile memory is hard to be formed on the semiconductor chip 11C or an increase of the cost is caused, the above configuration is particularly effective.

Furthermore, when the first memory portion 12C and the second memory portion 13C are DRAMs formed on a semiconductor chip in the same production step, since the production step is shared, the above configuration can be realized without increasing the number of steps.

Also, by using a DRAM cell (for example, a 2T2C type cell), wherein a failure rate of the memory element is low comparing with that in the first memory portion 12C, as the second memory portion 13C, arising of defects can be suppressed in the second memory portion 13C, so that an access to a defective point of the first memory portion 12C can be more certainly prevented by referring to the address transformation table of the second memory portion 13C.

Note that when using DRAMs as the first memory portion 12C and the second memory portion 13C, by preventing an access to a page or memory block having a low data retention ability by using the above method, it is possible to improve a data retention ability of the entire semiconductor memory device and to reduce refreshing frequency, so that the standby power consumption can be also reduced.

Fourth Embodiment

Next, a fourth embodiment of the present invention will be explained.

Figure 5:
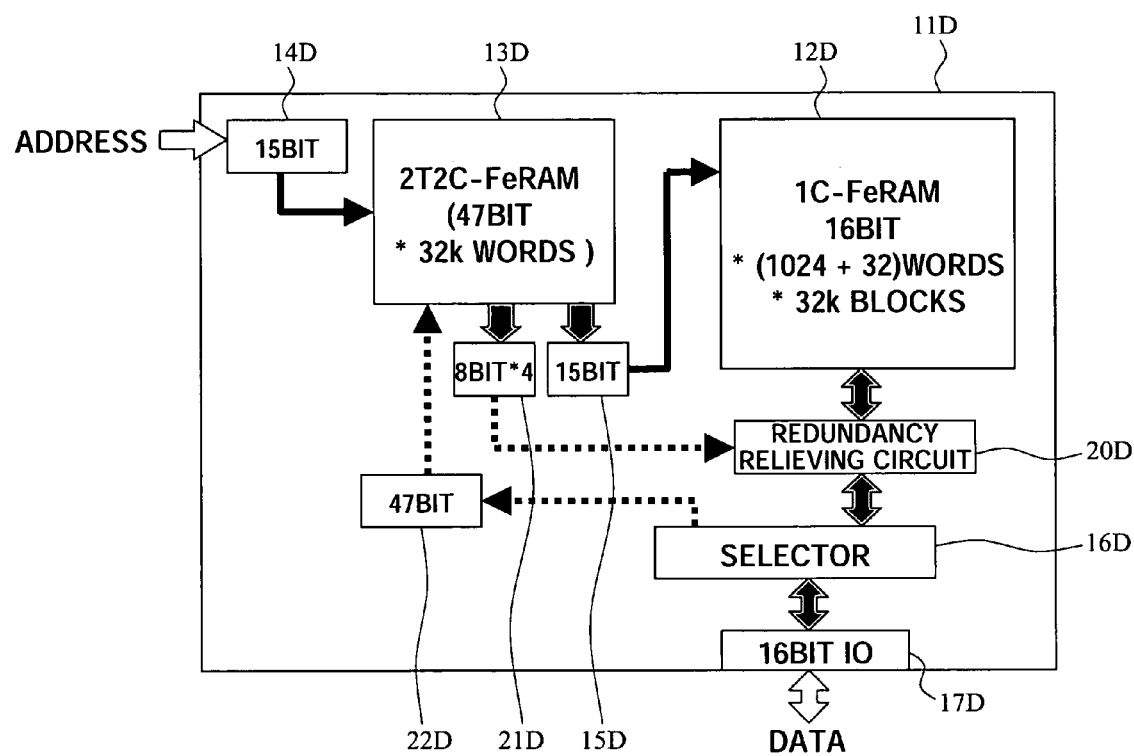
FIG. 5 is a view of an example of the configuration of a semiconductor memory device according to a fourth embodiment.

FIG. 5 is a view of an example of the configuration of a semiconductor memory device according to the fourth embodiment of the present invention.

The semiconductor memory device shown in FIG. 5 includes a first memory portion 12D, a second memory portion 13D, registers 14D, 15D 21D and 22D, a selector 16D, an input/output circuit 17D, and a redundancy relieving circuit 20D, formed on the same semiconductor chip 11D.

Note that the first memory portion 12D is an embodiment of a first memory portion of the present invention.

The second memory portion 13D is an embodiment of a second memory portion of the present invention.

A circuit including the register 14D is a first circuit according to embodiment of the present invention.

A circuit including the register 15D is a second circuit according to embodiment of the present invention.

The redundancy relieving circuit 20D is an embodiment of a second access inhibition circuit of the present invention.

The first memory portion 12D is a memory portion corresponding to a body memory for storing user data and is composed of about 32 k number of memory blocks in the present embodiment.

Each memory block of the first memory portion 12D is composed of a memory unit group made by 1 C type ferroelectric memory cells in the same way as in the first memory portion 12 (FIG. 1) explained above. The 1 k number of memory units, wherein 16 cells are connected in common, are arranged in the word line direction, furthermore, on the extension, 32 memory units are arranged as a spare for defect relieving. A memory region of each memory block is about 2 k bytes as a data region and 64 bytes as a spare region. A capacity of the first memory portion 12D as a whole is about 528 M bits.

In the first memory potion 12D, one block is selected from the 32 k number of memory blocks by an input of a 15-bit address to an address decoder thereof. At reading, data therein is serially output by 16 bits at a time successively.

The second memory portion 13D stores pointers indicating a memory region in the first memory portion 12D and information on defects included in the memory region corresponding to the pointers. When reading a pointer, the second memory portion 13D also reads defect information corresponding to the pointer.

The second memory portion 13D is composed, for example, of a 2T2C complementary type ferroelectric memory cell group in the same way as in the second memory portion 13 (FIG. 1) explained above, wherein the failure rate is low comparing with that in the first memory portion 12D.

The second memory portion 13D has an input and output of, for example, 15 bits for an address transformation table and 32 bits for defect information and is composed of 32 k words. Accordingly, one word is selected by inputting 15 bits to an address decoder thereof, and (15+32) bits of data is output. In this case, a capacity of the second memory portion is about 1.5 M bits, which is far smaller than that of the first memory portion 12D. Therefore, even when a 2T2C type cell having a large cell area is used, an area is not increased much.

The redundancy relieving circuit 20D inhibits an access to a specified position when the position of a defect is specified in defect information read from the second memory portion 13D. It also changes an access to the first memory portion 12D from an access to the data region including the defect to an access to the spare region.

Figure 6:
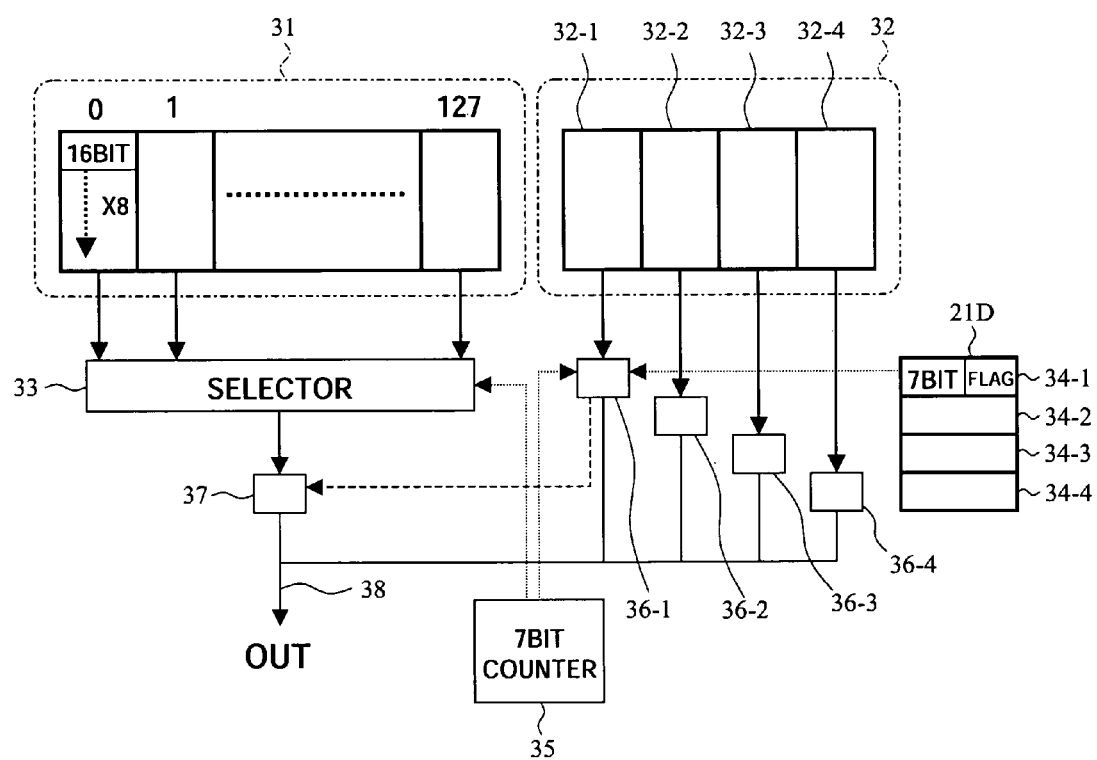
FIG. 6 is a view of an example of the configuration of a redundancy relieving circuit.

FIG. 6 is a view of an example of the configuration of the redundancy relieving circuit 20D.

The redundancy relieving circuit 20D shown in FIG. 6 includes registers 31 and 32, a selector 33, a counter 35, comparison determination circuit 36-1 to 36-4 and a switch 37.

The register 31 latches input/output data of the data region in one memory block in the first memory portion 12D.

The register 32 latches input/output data of the spare region in one memory block in the first memory portion 12D.

The register 32 is divided to four 16-byte spare regions 32-1 to 32-4, respectively connected to an input/output terminal 38 via the later explained comparison determination circuits 36-1 to 36-4.

The register 21D stores four defect information 34-1 to 34-4 read from the second memory portion 13D. Each of the defect information 34-1 to 34-4 includes 7-bit position data indicating a position of a defect in the memory block and 1-bit flag data indicating whether a defect exists at the position indicated by the position data or not. The defect information 34-1 to 34-4 respectively correspond to the spare regions 32-1 to 32-4, and when relieving a defect based on a certain defect information, a spare region corresponding to the defect information is used for relieving the defect.

The selector 33 divides input/output data of the data region in the first memory portion 12D to 128 fields each having 16 bytes, selects any one of the divided 128 fields and input or output data in the selected field by the switch 37. Selection of the field is determined in accordance with a value of the 7-bit counter 35.

The counter 35 generates a 7-bit counter value, so that the selector 33 successively selects the 128 fields.

The comparison determination circuit 36-n (n indicates an integer from 1 to 4) respectively receives defect information 34-n stored in the register 21 and, when position data included therein is equal with a counter value of the counter 35 and the flag data is valid (the case where a defect exists is "valid" and the case of not existing is "invalid" here), turns off the switch 37 and connects a field 32-n of the register 32 to the input/output terminal 38. When the position data is not equal with the counter value or when the flag data is not valid, connection between the field 32-n and the input/output terminal 38 is cut and the switch 37 is turned on.

The switch 37 turns on or turns off connection between the selector 33 and the input/output terminal 38 in response to control by the comparison determination circuits 36-1 to 36-4.

According to the redundancy relieving circuit 20D shown in FIG. 6, data in the 128 fields of the register 31 is selected successively by the selector 33 in accordance with the 7-bit counter 35 and input or output serially from the selector 33 by 16 bits at a time. On the other hand, in the comparison determination circuit 36-n, a counter value of the counter 35 is compared with position data of the defect information 34-n and, based on the comparison result and a state of the flag data, one of the register 31 of the data region or the register 32 of the spare region becomes accessible from the input/output terminal 38. Namely, when the position data matches with the counter value and the flag data is valid, the region 32-n of the register 32 is connected to the input/output terminal 38 and the switch 37 turns off. Inversely, when position data of the defect information 34-n does not match with the counter value or when the flag data is not valid, connection between the field 32-n and the input/output terminal 38 is cut, the switch 37 is turned on, and a data region being selected by the selector 33 becomes accessible via the input/output terminal 38.

The above is an explanation on the redundancy relieving circuit 20D.

An explanation will be made by returning back to FIG. 5 below.

The register 14D latches address data input to the semiconductor chip 11D and input the same to the second memory portion 13D.

The register 15D latches a pointer read in the second memory portion 13D and input the same as address data to the first memory portion 12D.

The register 21D latches four of 8-bit defect information read in the second memory portion 13D as explained in the explanation on FIG. 6.

The register 22D stores data (a pointer+defect information) input from the input/output circuit 17D via the selector 16D and written to the second memory portion 13D.

The input/output circuit 17D is for being input and outputting write data and read data of the present semiconductor memory device, and a 16-bit signal is input or output in the present embodiment.

The selector 16D connects a 16-bit signal line of the input/output circuit 17D to a data input/output terminal of the first memory portion 12D or the register 22D. Switching of this connection is made in response to a not shown control signal, for example, supplied from the outside of the semiconductor chip 11D.

Here, an operation example of the semiconductor memory device shown in FIG. 5 configured as the above will be explained.

When 15-bit address data is input to the semiconductor chip 11D, the address data is latched by the register 14D and input to an address decoder of the second memory portion 13D.

From the second memory portion 13D, data to be a pointer to the first memory portion 12D is output from a memory region corresponding to the input address data and latched by the register 15D. Also, from the memory portion 13D, defect information indicating a defect point in a memory block indicated by the pointer is output at the same time and latched by the register 21D.

A pointer of the register 15D is input to an address decoder of the first memory portion 12D and, thereby, one memory block is selected and a total of 2.1 k bytes of data is output to the redundancy relieving circuit 20D. The redundancy relieving circuit 20D refers to defect information of the register 21D and performs defect relief in the selected memory block by the operation explained above. As a result, a defective memory unit in the data region becomes a non-selected state and a memory unit in the spare region becomes a selected state instead, then, stored data in the selected memory unit is output serially from the input/output circuit 17D by 16 bits at a time.

The above explanation is an operation at reading data, but also at writing data, one memory block is selected in the first memory portion 12D in the same way, furthermore, a defective memory unit therein becomes a selected state instead of a memory unit in the spare region. In that state, desired data in an amount of 2 k bytes is serially written to a desired field by 16 bits at a time.

An address transformation table is configured to skip defective blocks existing in the first memory portion 12D as explained in the explanation on the remapping method above, thus, pointers of defective blocks are eliminated from the address transformation table for that purpose.

When writing an address transformation table to the second memory portion 13D, connection of the selector 16 is switched by a control signal, for example, from the outside of the semiconductor chip 11D, and a 16-bit signal line of the input/output circuit 17D is connected to the register 22D. Then, 47 bits of data is transmitted by dividing for three times from the input/output circuit 17D, latched by the register 22D and written in the second memory portion 13D. As a result, desired address transformation table can be written in the second memory portion 13D.

As explained above, according to the semiconductor memory device shown in FIG. 5, since a pointer to the first memory portion 12D and defect information in a memory region corresponding to the pointer are made to be a set to be stored in the second memory portion 13D, a set of a pointer and defect information can be retrieved at a time by a one time memory access. As a result, defect information being independent for each memory block as an access object can be instantly retrieved without an overhead by the operation, so that an independent defect point of each memory block can be relieved at a high speed. As a result, far higher relieving ability can be provided comparing with the redundancy relieving in units of bit lines and word lines at a memory array level of the related art, and an initial defect rate of the memory block itself can be drastically reduced. Namely, in addition to preventing an access to a defective block by referring to an address transformation table stored in the second memory portion 13D, a defective unit in a memory block as an access object can be effectively relieved based on defect information made to be a set with a pointer.

Figure 7:
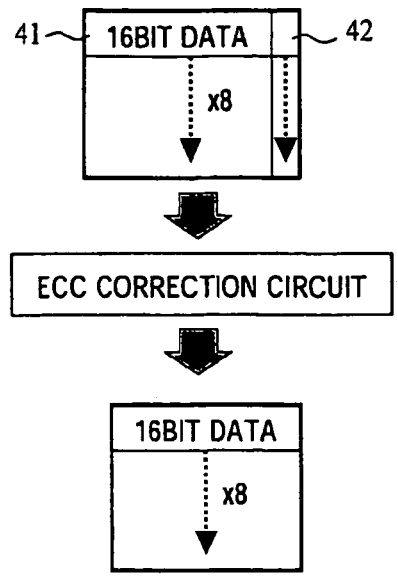
FIG. 7 is a view of an example of performing error correction coding processing on stored data of the semiconductor memory device shown in FIG. 5.
Figure 8:
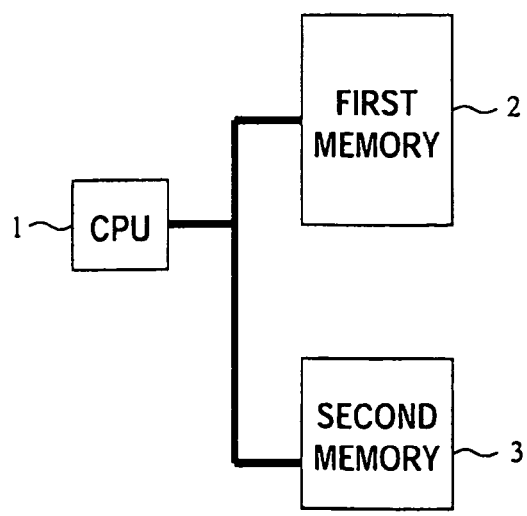
FIG. 8 is a view of a configuration example of a general system wherein remapping is performed.
Figure 9:
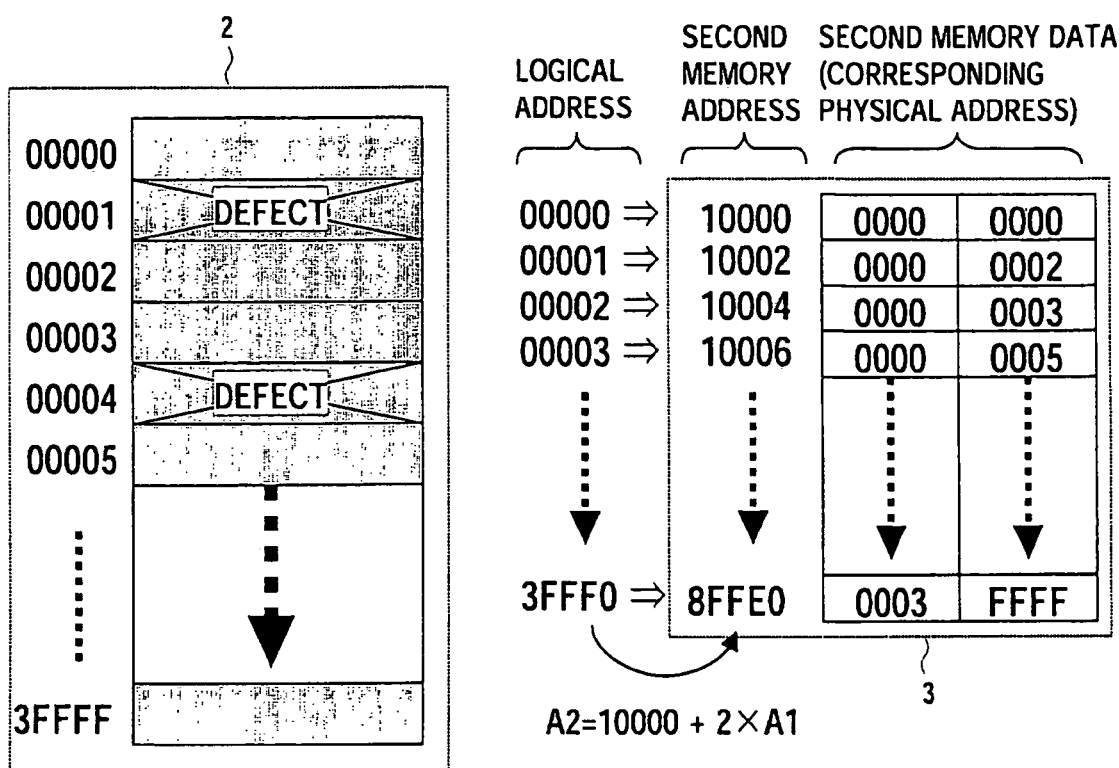
FIG. 9 is a schematic view of remapping in the system shown in FIG. 8.

Note that the redundancy relief as above may be combined with encoding correction by the ECC, so that the efficiency of the defect relief can be furthermore improved. For example, in the redundancy relieving circuit 20D shown in FIG. 6, a 16-byte data region or a spare region is selected as a result of the redundancy relief, and preferably, parity is furthermore added to the 16-byte unit to perform encoding correction. FIG. 7 shows a schematic view thereof. Here, by adding 1-byte parity 42 to a 16-byte data 41, correction of one bit in the 16 bytes is made possible.

For example, a 16-byte field including a plurality of defective bits is replaced by a spare by the redundancy relieving circuit 20D, and scattered one-bit defects are corrected by encoding correction by the ECC. A memory block at a poor quality, which cannot be fully corrected by that, is eliminated from the address transformation table to inhibit accesses.

To obtain a 90% chip yield in a large capacity semiconductor memory device having a capacity of a 1G bits level only by the redundancy relief in units of bit lines and word lines of the related art, the defective arising rate of cells has to be suppressed, for example, to $10^{-7}$ or lower. However, when three kinds of relieving method are combined as above, the same yield can be obtained even at a cell defective arising rate of, for example, $10^{-3}$ or so. In the case of relieving only by the ECC, it is possible to deal with the case where defects converge partially, while when applying the method of the present embodiment, it is possible to deal with defects of any type. Accordingly, a production yield of large capacity memories can be drastically improved.

The present invention was explained by dividing to embodiments above, but the present invention is not limited to the embodiments and includes a variety of modifications.

For example, numbers (memory capacities and bit lengths, etc.) mentioned in the above embodiments are examples for making explanations, and the present invention is not limited to them. Namely, they may be changed to any numbers in the present invention.

Also, kinds of memories (a ferroelectric memory, SRAM, DRAM and flash memory, etc.) mentioned in the above embodiments are also examples for making explanations, and a variety of other memories may be applied to the present invention.

For example, a nonvolatile memory used in the above embodiments is not limited to a ferroelectric memory and a flash memory, and a magnetic random access memory (MRAM), an ovonic unfilled memory (OUM) and a resistance random access memory (RRAM), etc. may be used.

Also, in the above embodiments, an example of configuring the first memory portion and the second or third memory portion for storing pointers by two kinds of memories produced by the same step but having different failure rates was explained. As combinations of memories having the same memory element, able to be produced in the same production step and having different failure rates, for example, the following may be mentioned. In all cases, the latter has a lower integration degree comparing with that of the former, but the operation margin is large and the failure rate is lower by that amount.

EXAMPLE 1 first memory: a memory for storing one bit in a single cell second memory or third memory: a complementary type memory for storing one bit in two cells

EXAMPLE 2 first memory: a memory having a small memory element area second memory or third memory: a memory having a large memory element area

EXAMPLE 3 first memory: a multivalued memory
second memory or third memory: a binary memory

EXAMPLE 4 first memory: a memory wherein a selection transistor is not provided for each cell
second memory or third memory: a memory wherein a selection transistor is provided for each cell
More specifically, for example, the following may be mentioned.

EXAMPLE 5 first memory: a 1T1C type DRAM
second memory or third memory: a 2T2C complementary type DRAM or a DRAM having a larger capacitor area than that of the first memory

EXAMPLE 6 first memory: a 1T1C type Fe DRAM
second memory or third memory: a 2T2C complementary type Fe DRAM or a Fe DRAM having a larger capacitor area than that of the first memory

EXAMPLE 7 first memory: a 1C type Fe RAM
second memory or third memory: a 1T1C type Fe RAM, a 2T2C complementary type Fe RAM or a Fe RAM having a larger capacitor area than that of the first memory

EXAMPLE 8 first memory: a multivalued flash memory
second memory or third memory: a binary flash memory

EXAMPLE 9 first memory: a NAND type flash memory
second memory or third memory: a NAND type flush memory having a small number of cells serially connected to a cell string It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor memory device, comprising:
a first memory portion; and
a second memory portion configured to store a pointer indicating a memory region in said first memory portion;
wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, further comprising:
a first circuit formed on said semiconductor chip, for transmitting a signal from a terminal for inputting an address data to said semiconductor chip, to an address input terminal of said second memory portion; and
a second circuit formed on said semiconductor chip, for transmitting a signal from a data reading terminal of said second memory portion to the address input terminal of said first memory portion.

2. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, wherein:
said second memory portion reads said pointer from a memory region specified by a part or all of input address data; and
said first memory portion reads or writes data in a memory region specified by a part or all of said pointer or in a memory region specified by data,
where a part or all of said pointer and the rest of said address data not input to said second memory portion are combined.

3. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer,
wherein said second memory portion includes a nonvolatile memory,
wherein said first memory portion includes a nonvolatile memory formed on said semiconductor chip by a common production process with said second memory portion, and
wherein said second memory portion includes a nonvolatile memory, wherein a failure rate of a memory element is lower than that in said first memory portion.

4. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, further comprising:
a third memory portion formed on said semiconductor chip, including a nonvolatile memory for storing said pointer;
wherein said second memory portion includes a random access memory (RAM),
where said pointer stored in said third memory is loaded at the time of starting up.

5. A semiconductor memory device as set forth in claim 4, wherein said first memory portion includes a nonvolatile memory formed on said semiconductor chip by a common production process as said third memory portion.

6. A semiconductor memory device as set forth in claim 5, wherein said third memory portion includes a nonvolatile memory,
where a failure rate of a memory element is lower than that in said first memory portion.

7. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, wherein said second memory portion includes a random access memory (RAM),
where said pointer is loaded from outside of said semiconductor chip at the time of starting up.

8. A semiconductor memory device as set forth in claim 7, wherein said first memory portion and said second memory portion respectively include a dynamic random access memory (DRAM) formed on said semiconductor chip by a common production process.

9. A semiconductor memory device as set forth in claim 8, wherein said second memory portion includes a DRAM,
where a failure rate of a memory element is lower comparing with that in said first memory portion.

10. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, wherein
said second memory portion stores predetermined invalid data in a memory region of not storing said pointer; and
a first access inhibition circuit is provided for determining whether or not data read from said second memory portion is said invalid data and, inhibiting an access to said first memory when it is determined to be said invalid data.

11. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, wherein said first memory portion has a larger memory region than a memory region able to be specified as an access object by said input address data.

12. A semiconductor memory device, comprising:
a first memory portion; and
a second memory portion configured to store a pointer indicating a memory region in said first memory portion; wherein
said second memory portion is formed on a semiconductor chip on which said first memory portion is formed;
said second memory portion reads a pointer corresponding to an input address data; and
said first memory portion reads or writes data in a memory region therefrom or therein in accordance with said pointer, wherein said second memory portion stores said pointer and defect information on a defect included in a memory region corresponding to the pointer of said first memory portion and, when reading said pointer, reads defect information corresponding to the pointer.

13. A semiconductor memory device as set forth in claim 12, comprising a second access inhibition circuit for inhibiting an access to a specified position when said defect information specifies the position of a defect.

14. A semiconductor memory device as set forth in claim 13, wherein
said first memory has a spare memory region for each memory portion corresponding to said pointer; and
said second access inhibition circuit changes an access to said first memory portion from an access to a memory region including a defect to an access to said spare memory portion when a position of the defect is specified by said defect information.

15. A semiconductor memory device as set forth in claim 14, wherein said first memory portion stores data subjected to error correction encoding processing.

* * * * *